(12) United States Patent
Letual et al.

(10) Patent No.: US 8,649,157 B2
(45) Date of Patent: Feb. 11, 2014

(54) INTEGRATED CAPACITIVE DEVICE AND INTEGRATED ANALOG DIGITAL CONVERTER COMPRISING SUCH A DEVICE

(75) Inventors: Stephane Letual, St-Egreve (FR); Sarah Verhaeren, Le Versoud (FR)

(73) Assignee: STMicroelectronics SA, Montrouge (FR)

( * ) Notice: Subject to any disclaimer, the term of this patent is extended or adjusted under 35 U.S.C. 154(b) by 49 days.

(21) Appl. No.: 13/523,211

(22) Filed: Jun. 14, 2012

(65) Prior Publication Data
US 2013/0003255 A1    Jan. 3, 2013

(30) Foreign Application Priority Data
Jun. 15, 2011   (FR) ........................ 11 55195

(51) Int. Cl.
*H01G 4/012*         (2006.01)

(52) U.S. Cl.
USPC .............. 361/304; 361/301.4; 361/306.1; 361/306.3; 361/305; 361/311

(58) Field of Classification Search
USPC ........ 361/304, 303, 305, 301.2, 301.4, 306.1, 361/306.3, 311–313, 321.1, 328
See application file for complete search history.

(56) References Cited

U.S. PATENT DOCUMENTS

| | | | |
|---|---|---|---|
| 6,542,351 B1 * | 4/2003 | Kwang | 361/303 |
| 6,903,402 B2 * | 6/2005 | Miyazawa | 257/296 |
| 7,485,914 B2 * | 2/2009 | Huang et al. | 257/309 |
| 7,557,426 B2 * | 7/2009 | Baumgartner et al. | 257/532 |
| 7,635,888 B2 * | 12/2009 | Harris et al. | 257/307 |
| 7,838,965 B2 * | 11/2010 | Klee et al. | 257/532 |
| 8,085,524 B2 * | 12/2011 | Roozeboom et al. | 361/306.2 |
| 8,362,589 B2 * | 1/2013 | Quinn | 257/532 |
| 2006/0270145 A1 | 11/2006 | Bach | |
| 2008/0239619 A1 | 10/2008 | Okamoto et al. | |

FOREIGN PATENT DOCUMENTS

| | | |
|---|---|---|
| JP | 2005183739 A | 7/2005 |
| JP | 2007142379 A | 6/2007 |

* cited by examiner

*Primary Examiner* — Nguyen T Ha (74) *Attorney, Agent, or Firm* — Allen, Dyer, Doppelt, Milbrath & Gilchrist, P.A.

(57) ABSTRACT

An integrated capacitive device includes an electrically conducting comb, at least some of whose teeth form first electrodes of capacitors, and electrically conducting fingers extending between the teeth of the comb so as to form second electrodes of the capacitors. The device includes a first finger-teeth set having a single reference finger forming a reference capacitor having a reference capacitive value, at least one second finger-teeth set including several fingers, the reference finger and the number of fingers of the second finger-teeth set or sets forming a geometric series with ratio two. At least one additional set includes a single additional finger forming, with at least one tooth of the comb, an additional capacitor having an additional capacitive value substantially equal to half the reference capacitive value.

24 Claims, 6 Drawing Sheets

INTEGRATED CAPACITIVE DEVICE AND INTEGRATED ANALOG DIGITAL CONVERTER COMPRISING SUCH A DEVICE

FIELD OF THE INVENTION

The invention relates to integrated capacitive devices, and more particularly to those usable in converters of the analog digital type.

BACKGROUND OF THE INVENTION

At present, capacitive networks are used for analog/digital converters (ADCs), for example for successive approximation converters, also known as Successive Approximation Register (SAR) converters. Capacitive networks include several switched capacitors, respectively having different capacitive values. Generally, an analog/digital converter of the "n-bit" type makes it possible to convert an analog signal into an n-bit digital word, and the resolution of the converter is then said to be equal to n bits.

Figure 1:
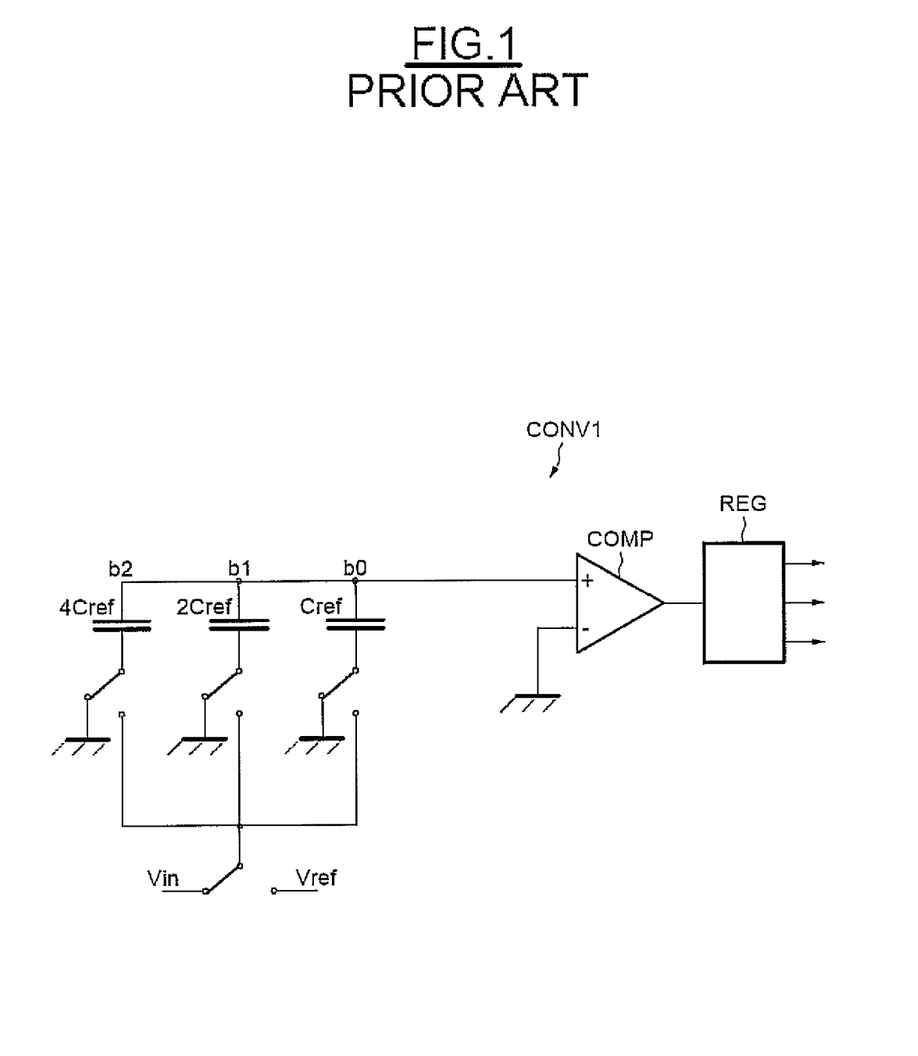
FIG. 1, already described, is a schematic diagram illustrating a prior art converter of the three-bit type.

FIG. 1 schematically illustrates a partial example of a converter CONV1 of the three bits b0, b1, b2 type, known to those skilled in the art. The switched capacitive network of this converter is coupled to a comparator COMP and includes three capacitors having capacitive values equal to Cref, 2Cref, and 4Cref respectively. Furthermore, the comparator COMP is coupled to a register REG which controls the various switches connected to the capacitors. Each capacitor makes it possible to determine a bit of the digital word corresponding to the analog signal to be converted. The capacitor having the smallest capacitance Cref is associated with the low-order bit b0 of the converter, and that having the largest capacitance 4Cref is associated with the high-order bit b2.

Figure 2:
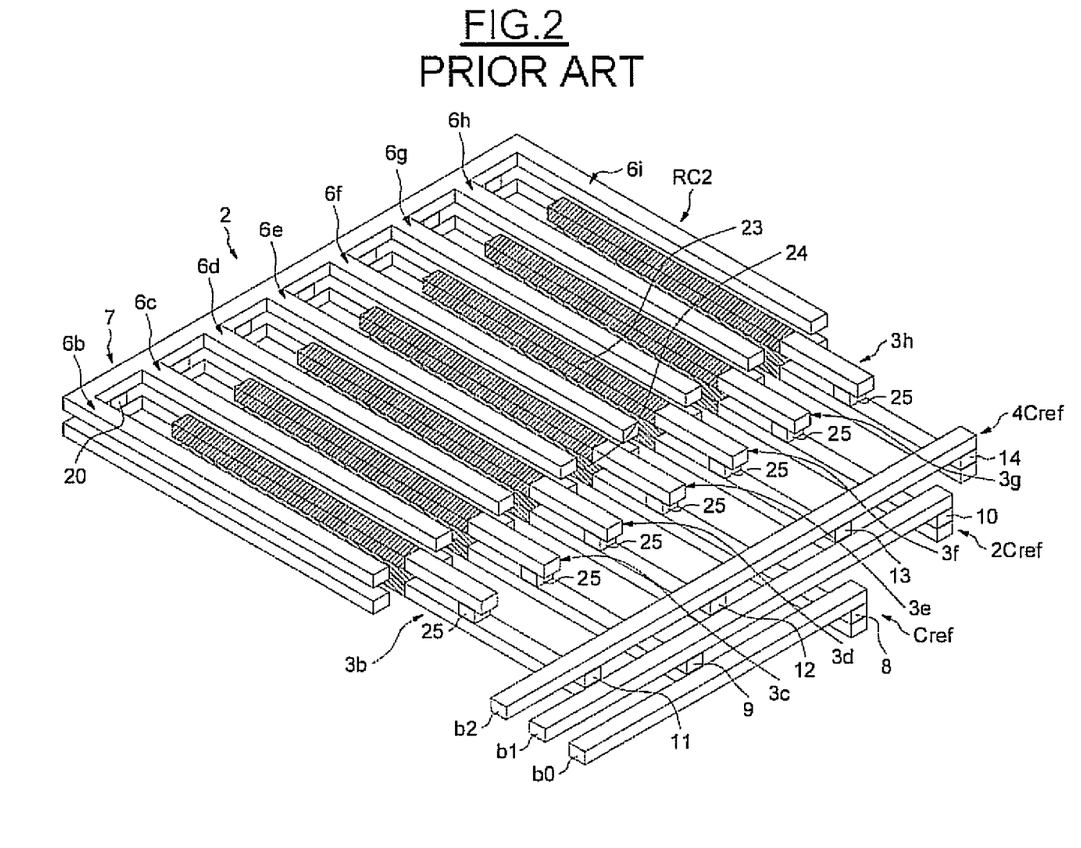
FIG. 2, already described, is a perspective view of an embodiment of a prior art converter of three-bit type.

FIG. 2 schematically illustrates a three-quarter view of an embodiment of a conventional capacitive network RC2 of a converter of the three bits b0, b1, b2 type. The capacitive network RC2 comprises an electrically conducting comb 2 including eight identical teeth 6b to 6i forming first electrodes of seven elementary capacitors. The capacitive network RC2 furthermore includes seven electrically conducting fingers 3b to 3h so as to form the second electrodes of the seven elementary capacitors. Each second electrode is coupled to one of the connection tracks b0, b1, b2 respectively associated with the three bits b0, b1, b2 of the converter.

The first connection track b0 is associated with the low-order bit b0 of the converter, and the third track b2 is associated with the high-order bit b2. The capacitive network RC2 includes three capacitors respectively coupled to the three connection tracks b0, b1, b2. Each capacitor is represented by a finger-teeth set. The first fingers-teeth set includes a single reference finger 3e extending between two teeth 6e, 6f of the comb 2. The finger-teeth set thus forms a reference capacitor having a reference capacitive value Cref (bit b0).

The second finger-teeth set comprises two fingers 3c, 3g coupled to the second connection track b1. The capacitive value of the second set (second capacitor) is equal to twice the reference capacitance (bit b1). The third finger-teeth set (third capacitor) comprises, for its part, four fingers 3b, 3d, 3f, 3h coupled to the third connection track b2. The capacitive value of the third set is equal to four times that of the reference capacitance (bit b2). Each finger of the second and third sets are situated on either side of the reference finger 3e. Such a converter of three-bit type includes capacitors having capacitances whose values form a geometric series with ratio two, Cref, 2Cref, 4Cref.

In this embodiment of the prior art, all the elementary capacitors are identical.

U.S. patent application US 2006/0270145 also describes a capacitive network comprising a comb comprising several teeth, and several capacitors, each capacitor comprising one or more fingers linked together, with each finger being nested between two teeth of the comb and being identical to the other fingers.

At present, when it is desired to increase the resolution of a converter, it is necessary to increase the number of elementary capacitors, that is to say to increase the number of fingers and of teeth.

Given that the capacitive values form a geometric series with ratio two, as does the number of fingers, if it is desired to increase the resolution of an "n-bit" converter by one bit, it is necessary to add $2^n$ elementary capacitors, that is to say $2^n$ fingers. For example, to obtain a converter of four-bit type, it is necessary to add eight elementary capacitors (eight fingers) to the capacitive network RC2 of the converter of three-bit type. Increasing the number of elementary capacitors gives rise to an increase in the number of signals associated with the bits of the converter and therefore a decrease in the speed of processing of the analog input signal. It also gives rise to an increase in the size of the converters and therefore that of the integrated circuits using these converters.

SUMMARY OF THE INVENTION

According to one embodiment, an integrated capacitive device is provided that allows an increase in the resolution of a converter with a reduced occupied space.

According to one aspect, there is thus provided an integrated capacitive device comprising an electrically conducting comb, at least some of whose teeth form first electrodes of capacitors, and electrically conducting fingers extending between the teeth of the comb so as to form second electrodes of the capacitors. The device comprises a first finger-teeth set comprising a single reference finger forming a reference capacitor having a reference capacitive value, and at least one second finger-teeth set comprising several fingers distributed on either side of the reference finger, the reference finger and the number of fingers of the second finger-teeth set or sets forming a geometric series with ratio two.

According to a general characteristic of this aspect, the device furthermore comprises at least one additional set comprising a single additional finger forming with at least one tooth of the comb an additional capacitor having an additional capacitive value substantially equal to half the reference capacitive value. Thus a capacitive network is provided which may be used in a converter, for example of the analog/digital type, and whose additional set makes it possible to increase the resolution of a conventional converter that only had identical elementary capacitors.

Furthermore, in the prior art, when it is desired to increase the resolution of a successive approximation analog/digital converter, the number of fingers is increased to determine the high-order bit, without modifying the finger relating to the low-order bit. According to one aspect of the invention, the number of fingers is increased to a lesser extent to determine the low-order bit without modifying the number of fingers relating to the high-order bit. In other words, it is possible to provide an "n-bit" resolution converter whose low-order bit is obtained by halving the reference capacitance of a conventional converter of resolution below "n−1 bits", instead of adding $2^n$ elementary capacitors to obtain the high-order bit.

The capacitive network thus proposed therefore makes it possible to increase the resolution of the converters while decreasing the number of elementary capacitors with respect to a conventional capacitor of the same resolution. Thus the increase in the size of the integrated converters is limited.

According to the embodiment of the additional finger, and regarding to the electrical environment of the additional finger, it is possible to obtain an additional capacitor having a capacitive value equal to, slightly greater or slightly less than half the reference capacitive value, for example to within a percentage. Stated otherwise, the capacitive value of the additional finger is equal to half the reference capacitive value $$Cref/2 \pm \frac{x}{100} \cdot \frac{Cref}{2},$$

where x can vary from 1 to 10%, or from 1 to 20% according to the embodiments of the additional finger.

The additional set may be situated alongside the second finger-teeth set or sets. The additional set can comprise an additional tooth, the single additional finger extending between the additional tooth and a tooth of a second finger-teeth set.

According to one embodiment, the reference finger and the fingers of the second finger-teeth set or sets have one and the same first length, and the additional finger has a length substantially equal to half the first length. According to another embodiment, the reference finger and the fingers of the second finger-teeth set or sets are embodied on a first even number of metallization levels, and the additional finger is embodied on a number of metallization levels equal to half the first number.

Moreover, the reference finger and the fingers of the second set or sets can have first ends situated respectively at one and the same first distance from the back of the comb, the back of the comb then comprises at least one appendage extending opposite the additional finger, and the additional finger has an end situated at a distance greater than or equal to the first distance from the at least one appendage.

Use is made of a regular pattern which facilitates the embodiment of the integrated capacitive device. Indeed, one thus avoids creating different spaces between the ends of the fingers and the back of the comb. The device can furthermore comprise several additional finger-teeth sets, each comprising a single additional finger, the capacitive values of the additional capacitors thus formed forming substantially with the reference capacitive value a geometric series with ratio one half.

It is also possible to embody additional fingers having capacitive values which form, with the reference capacitive value, a geometric series with a ratio equal to, slightly greater or slightly less than a half to within a percentage, such as between 1% and 20% according to the embodiments. It is thus possible to further increase the resolution of a converter while greatly limiting its size with respect to the prior art.

According to yet another embodiment, the reference finger and the fingers of the second finger-teeth set or sets have one and the same first length, and the lengths of the additional fingers form substantially with the first length a geometric series with a ratio of one half.

According to another embodiment, the reference finger and the fingers of the second finger-teeth set or sets are embodied on a first even number of metallization levels, and the numbers of metallization levels of the additional fingers form with the first number a geometric series with a ratio of one half.

The reference finger and the fingers of the second set or sets can have first ends situated respectively at one and the same first distance from the back of the comb, the back of the comb then comprises several appendages extending respectively opposite the additional fingers, and each additional finger has an end situated at a distance greater than or equal to the first distance from the appendage which is situated opposite.

According to another aspect, there is proposed an integrated analog/digital converter comprising an integrated capacitive device defined hereinabove.

BRIEF DESCRIPTION OF THE DRAWINGS

Other advantages and characteristics will be apparent on examining the detailed description of non-limiting embodiments of the invention, and the appended drawings in which.

DETAILED DESCRIPTION OF THE PREFERRED EMBODIMENTS

Figure 3:
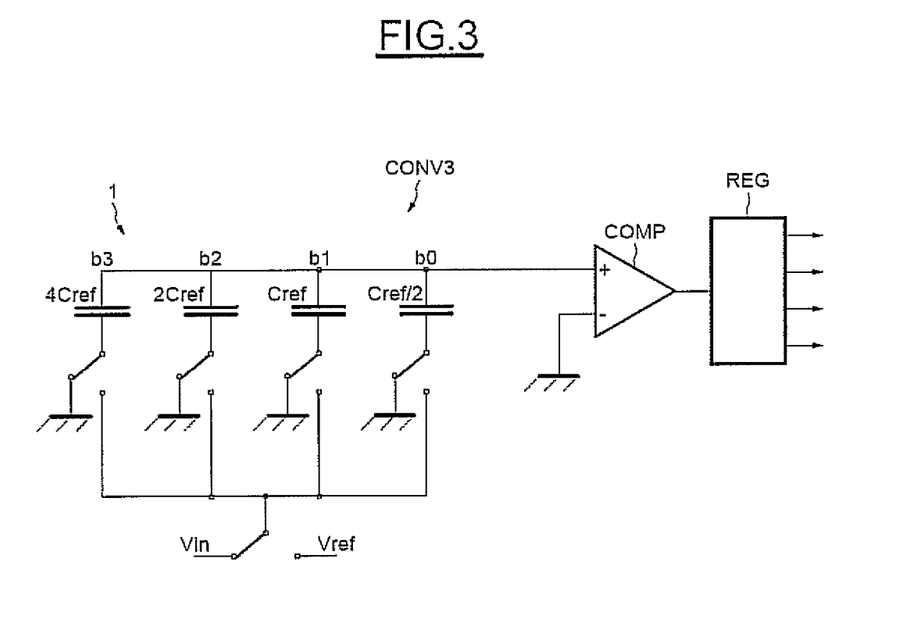
FIG. 3 is a schematic diagram illustrating a converter of the four-bit type according to a present embodiment.

In FIG. 3, the switched capacitive network 1 of the four-bit converter CONV3 includes, for the determination of the low-order bit b0, an additional capacitor having a capacitive value Cref/2 equal to half the capacitive value Cref of the reference capacitor which is here used to determine the bit b1. The capacitor having the value 4Cref is still used to determine the high-order bit b3.

Figure 4:
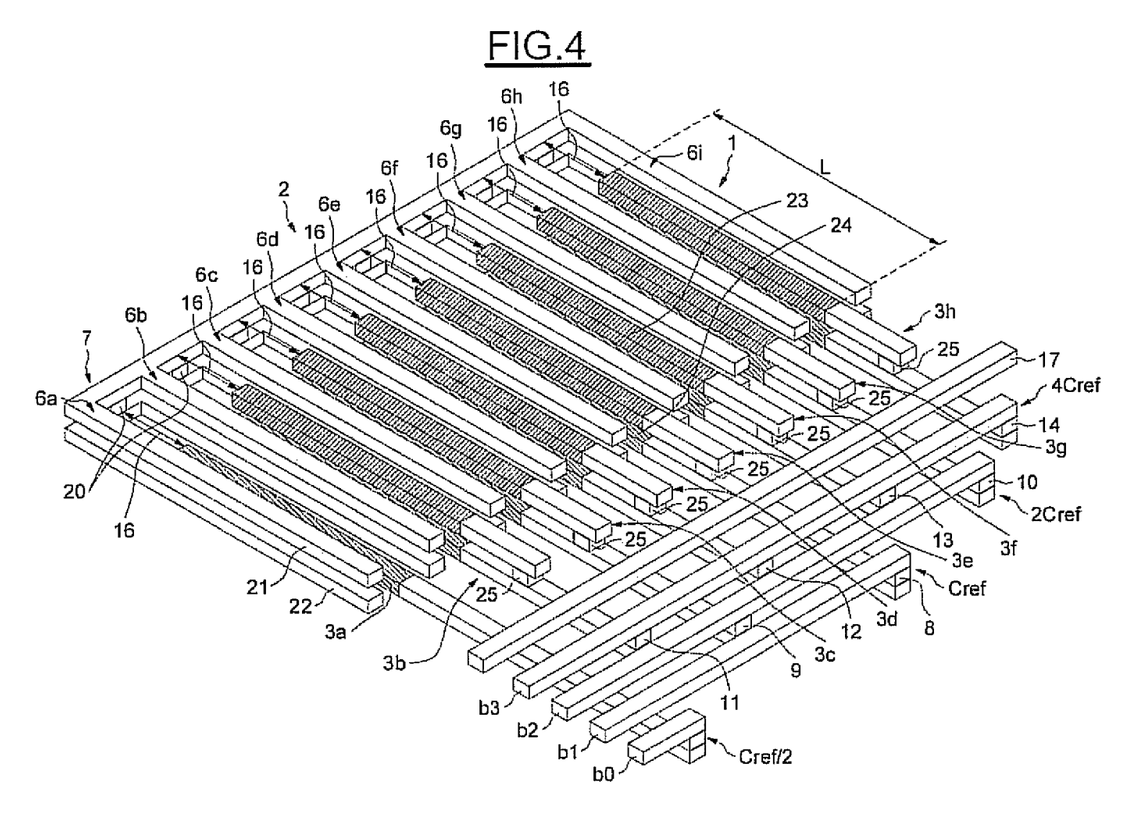
FIG. 4 is a perspective view illustrating a capacitive network of a converter of the four-bit type according to a present embodiment.
Figure 5:
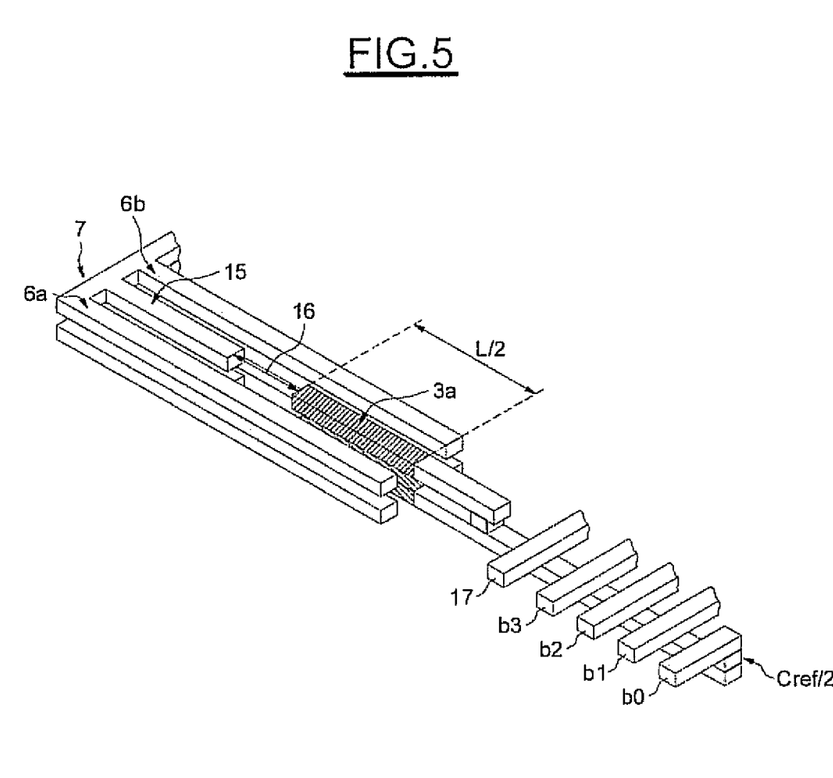
FIG. 5 is a perspective view illustrating a partial capacitive network of a converter of four-bit type according to another present embodiment.

FIGS. 4 and 5 illustrate various embodiments of the comb-shaped capacitive network 1. In FIG. 4, a three-quarter view of a first embodiment of an integrated capacitive device 1 intended to be used in an analog/digital converter of four-bit type is illustrated. The device 1 comprises the three finger-teeth sets already described in FIG. 2.

As indicates hereinabove, to obtain a converter of the four-bit type, the low-order bit b0 is embodied with the aid of an additional set having a capacitive value equal to half the reference capacitive value Cref. The finger-teeth sets of the three-bit converter that are described in FIG. 2 are thus preserved and the first set (reference capacitor) is then associated with the second bit b1, the second set with the third bit b2 and the third set with the high-order bit b3. By virtue of such a device 1, it is possible to obtain a converter comprising seven elementary capacitors and an additional capacitor and which is about half as wide as a conventional converter of the same resolution that had fifteen elementary capacitors.

In the embodiment described in FIG. 4, the comb 2 and the fingers are embodied on the basis of two metallization levels (an upper level and a lower level) separated by a dielectric. The back 7 of the comb 2 comprises two identical parts embodied respectively on the two metallization levels and coupled together by one or more vias 20. Furthermore, each tooth of the comb comprises two identical parts embodied respectively on the two metallization levels. For example, the first tooth 6a of the comb 2 comprises an upper part 21 and a lower part 22.

Moreover, each finger 3b, 3c, . . . , 3h of the three finger-teeth sets also includes two identical or matching parts embodied respectively on the basis of the two metallization levels and coupled together by way of a via 25.

Here, the term finger is intended to mean the part of the second electrode which is common with one or two teeth of the comb 2. The second part of the second electrode makes it possible, for its part, to couple the finger with a connection track bi. Here, the fingers 3a to 3h have been represented hatched and the second parts of the second electrodes non-hatched.

The finger 3e of the reference capacitor here comprises an upper part 23 and a lower part 24 identical to the upper part 23. The two parts 23, 24 which form the single finger 3e of the reference capacitor extend respectively between the two parts of the two teeth 6e, 6f of the comb 2. All the fingers (3b, 3c, . . . , 3h) of the three finger-teeth sets described in FIG. 2 have the same length. Thus, the elementary capacitors of the three finger-teeth sets have the same capacitive value. The second parts of the second electrodes can have different lengths according to the position of the connection tracks b0, b1, b2 to which they are coupled.

Furthermore, an element forming a screen 17 makes it possible to isolate at least the capacitors of the first metallization level from the connection tracks of the second metallization level. Thus the capacitive values of the capacitors are relatively slightly affected by the stray capacitances generated by the connection tracks b0 to b3.

In the example illustrated in FIG. 4, the finger 3a of the additional capacitor comprises a single part embodied on the basis of a single metallization level. The part of the finger 3a of the additional capacitor is identical to the lower part 23 (or upper part 24) of the single finger 3e of the reference capacitor. Thus, the additional capacitor has a capacitive value substantially equal to half the reference capacitive value of the reference capacitor.

The reference finger 3e is coupled, by way of a via 8, to the second connection track b1 (second bit b1). The fingers of the second finger-teeth set are coupled to the third bit b2 by two vias 9, 10 respectively, and the fingers of the third finger-teeth set are coupled to the high-order bit b3 by four vias 11 to 14 respectively.

In another embodiment, illustrated schematically in FIG. 5, the finger 3a of the additional capacitor can comprise two identical parts embodied respectively on the basis of the two metallization levels. In this example, the length of each part of the finger 3a of the additional capacitor is equal to half the length L of a part (upper or lower) of the single finger of the reference capacitor. Thus, the capacitive value of the additional capacitor is substantially equal to half the reference capacitive value.

Advantageously, the back 7 of the comb 2 comprises an appendage 15 extending between two teeth 6a, 6b of the comb 2. The appendage 15 also comprises two identical parts embodied respectively on the two metallization levels and coupled respectively to the two parts of the back 7 of the comb 2. Moreover, the fingers 3b, . . . , 3h of the finger-teeth sets each have an end situated at a first substantially constant distance 16 from the back 7 of the comb 2. Thus, the finger 3a of the additional capacitor has an end situated at a distance from an end of the appendage 15 which is greater than or equal to the first distance 16.

As a variant, it would also be possible to embody the comb 2 on a single metallization level and to then provide an additional finger, also embodied on this metallization level, but with a length equal to half the length of the reference finger.

Figure 6:
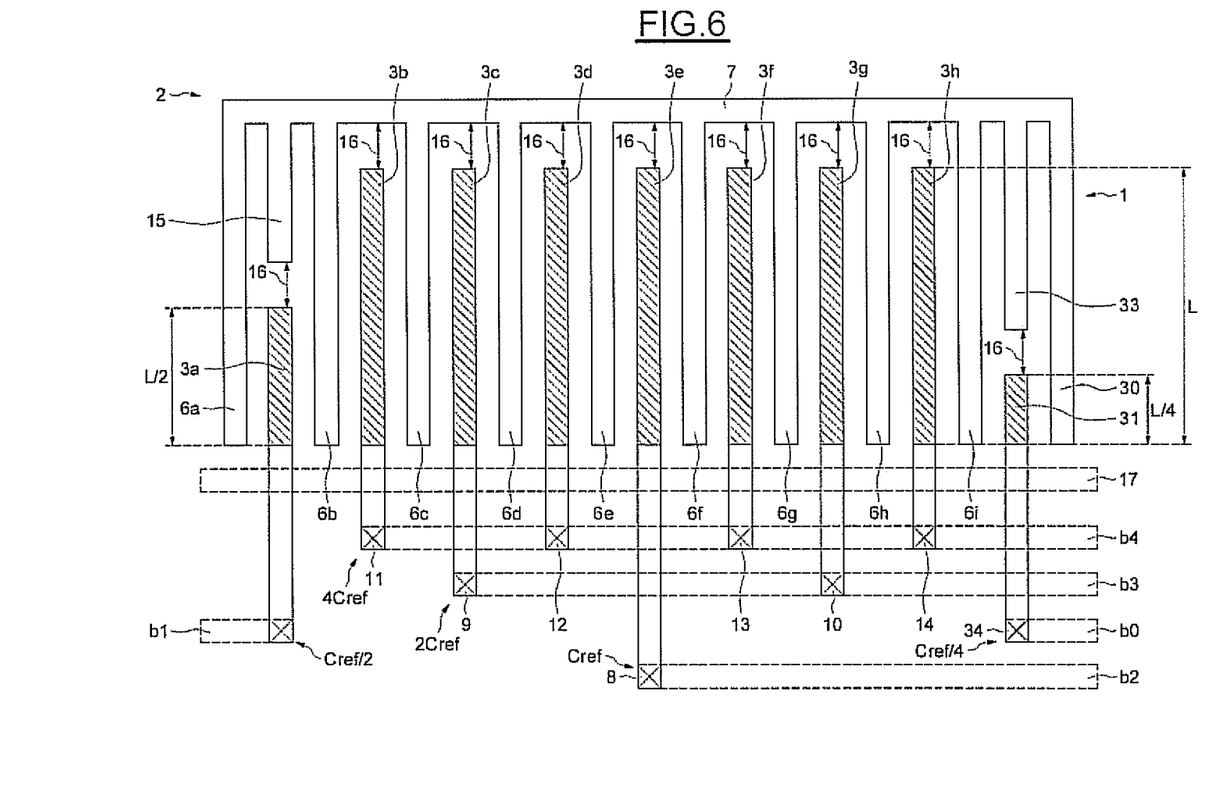
FIG. 6 is a schematic diagram illustrating an embodiment of a capacitive network of a converter of the five-bit type according to the invention.

In FIG. 6 has been represented in a schematic manner an example of an integrated capacitive device 1 comprising two additional finger-teeth sets which is usable for a five-bit converter. The comb 2 comprises an extra tooth 30 and the device 1 comprises a first additional finger-teeth set corresponding to that described in FIG. 5. The device 1 furthermore comprises a second additional finger-teeth set comprising a single additional finger 31 having a capacitive value substantially equal to the reference capacitive value divided by four. Moreover, an additional track b0 forms the low-order bit and is embodied on the basis of the upper metallization level. The low-order bit b0 is coupled to the second part of the second electrode of the second finger-teeth set by a via 34.

Advantageously, the comb 2 can furthermore comprise an extra appendage 33 extending between two teeth 6i, 30 of the comb 2 and being situated opposite the single additional finger 31 of the second finger-teeth set at a distance greater than or equal to the first distance 16.

In a general manner, the capacitive values of the additional capacitors thus formed form with the reference capacitive value Cref a geometric series with ratio one half (Cref, Cref/2, Cref/4, . . . ). In the example of FIG. 6, the comb 2 is embodied on a single metallization level, and the length L of the reference finger 3e and the lengths L/2 and L/4 of the additional fingers 3a, 31 form a geometric series with ratio one half.

As a variant, when the reference finger 3e and the other fingers of the comb 2 (with the exception of the additional fingers 3a, 3i) are embodied on a first even number of metallization levels, it is conceivable to embody the additional fingers 3a, 3i on numbers of metallization levels forming with the first number a geometric series with ratio one half.

The integrated capacitive device thus described exhibits the advantage of being relatively compact.

The invention is not limited to the embodiments described hereinabove but embraces all variants thereof.

Thus, it is advantageous to take account of the electrical environment at the ends of the fingers of the capacitors. Indeed, in a comb-like configuration, such as illustrated in FIGS. 4 to 6, it is observed that there exist edge effects, that is to say electric fields created at the end of a finger which is opposite the back of the comb. These electric fields depend on the electrical environment at the end of the finger and create a stray capacitive value. The capacitive value of a capacitor may be calculated according to the following relation:

$$Ccap = Clength + Cstray \quad \text{(equation 1)}$$

Where Ccap is the capacitive value of the capacitor; Clength is the length capacitive value due to the length of the finger of the capacitor; and Cstray is the stray capacitive value due to the effects of the electric fields generated at the end of the finger of the capacitor which is opposite the back of the comb 2.

When embodying, for example, an additional finger whose length is equal to half the length of the reference finger, the reference capacity is not completely halved. Indeed, if the value of the length capacitance Clength of the reference finger is actually halved, the value of the stray capacitance Cstray of the reference finger is not completely halved. In general, an additional finger having a length of less than half the length of the reference finger is embodied so as to compensate for the effects of the electric field and to obtain an additional capacitor having a capacitive value which is close to half that of the reference capacitor.

To get close to the capacitive value Cref/2, use will preferably be made of a length of the additional finger of less than half the length of the reference finger, for example a length lying between a quarter and a half of the length of the reference finger, and preferably a length equal to half the length of the reference finger to within a percentage which differs depending on the embodiment of the additional finger.

When embodying a finger comprising several parts extending over several metallization levels, the length of the finger is understood here as being the sum of the lengths of each part of the finger. Moreover, when the additional finger is embodied on the basis of a number of metallization levels different from the number used to embody the reference finger, the percentage lies between 1 and 10%. Stated otherwise the length of the additional finger is equal to half the length of the reference finger $$\pm \frac{x}{100} \cdot \frac{Lref}{2},$$

where x lies between 1 and 10, and Lref is the length of the reference finger.

When the additional finger is embodied on the basis of the same number of metallization levels as that used to embody the reference finger, the percentage lies between 1 and 20%. Stated otherwise x lies between 1 and 20.

Furthermore, when several additional fingers are embodied, it is possible to adjust the length of each of the additional fingers so as to obtain capacitors having capacitive values which form with the reference capacitive value Cref a geometric series with ratio equal to a half $$\pm \frac{x}{100} \cdot \frac{1}{2},$$

where x lies between 1 and 10, or 1 and 20 according to the embodiment of the additional fingers.

That which is claimed:

1. An integrated capacitive device comprising:
   an electrically conducting comb including a plurality of teeth, at least some of which define first electrodes of capacitors;
   electrically conducting fingers extending between the teeth of the comb to define second electrodes of the capacitors;
   the capacitors being defined by the plurality of teeth and corresponding fingers including
      a first finger-teeth set including a reference finger forming a reference capacitor having a reference capacitive value,
      at least one second finger-teeth set including several fingers distributed on at least one side of the reference finger,
      the reference finger and the several fingers of the at least one second finger-teeth set forming a geometric series with ratio two,
      at least one additional finger-teeth set including an additional finger defining, with at least one tooth of the comb, an additional capacitor having an additional capacitive value equal to a fraction of the reference capacitive value.

2. The integrated device according to claim 1, wherein the additional capacitive value of the additional capacitor is substantially equal to half the reference capacitive value.

3. The integrated device according to claim 1, wherein the additional set comprises an additional tooth, and the additional finger extends between the additional tooth and a tooth of the second finger-teeth set.

4. The integrated device according to claim 1, wherein the reference finger and the fingers of the second finger-teeth set have matching first lengths, and the additional finger has a length substantially equal to half the first length.

5. The integrated device according to claim 1, wherein the reference finger and the fingers of the second finger-teeth set have matching first lengths, and the additional finger has a length less than half the first length.

6. The integrated device according to claim 5, wherein the additional finger has a length between a quarter and a half of the first length.

7. The integrated device according to claim 1, wherein the reference finger and the fingers of the second finger-teeth set are embodied on a first even number of metallization levels, and the additional finger is embodied on a number of metallization levels equal to half the first even number.

8. The integrated device according to claim 1, wherein the reference finger and the fingers of the second set have first ends situated respectively at a same first distance a back of the comb; and wherein the back of the comb comprises at least one appendage extending opposite the additional finger, and the additional finger has an end situated at a distance greater than or equal to the first distance from the at least one appendage.

9. The integrated device according to claim 1, comprising several additional finger-teeth sets, each comprising an additional finger, and defining additional capacitors with capacitive values forming, substantially with the reference capacitive value, a geometric series with ratio one half.

10. The integrated device according to claim 9, wherein the reference finger has a first length, and the lengths of the additional fingers form substantially with the first length a geometric series with ratio one half.

11. The integrated device according to claim 9, wherein the reference finger and the fingers of the second finger-teeth set are embodied on a first even number of metallization levels, and the numbers of metallization levels of the additional fingers form, with the first even number, a geometric series with ratio one half.

12. The integrated device according to claim 9, wherein the reference finger and the fingers of the second set have first ends situated respectively at a same first distance from the back of the comb; and wherein the back of the comb comprises several appendages extending respectively opposite the additional fingers, and each additional finger has an end situated at a distance greater than or equal to the first distance from the corresponding appendage.

13. An integrated analog/digital converter comprising:
   an integrated capacitive device including
      an electrically conducting comb having a plurality of teeth, at least some of which define first electrodes of capacitors;
      electrically conducting fingers extending between the teeth of the comb to define second electrodes of the capacitors;
   the capacitors being defined by the plurality of teeth and corresponding fingers including
      a first finger-teeth set including a reference finger forming a reference capacitor having a reference capacitive value,
      at least one second finger-teeth set including several fingers distributed on at least one side of the reference finger, the reference finger and the several fingers of the at least one second finger-teeth set forming a geometric series with ratio two, at least one additional finger-teeth set including an additional finger defining, with at least one tooth of the comb, an additional capacitor having an additional capacitive value equal to a fraction of the reference capacitive value.

14. The integrated analog/digital converter according to claim 13, wherein the additional capacitive value of the additional capacitor is substantially equal to half the reference capacitive value.

15. The integrated analog/digital converter according to claim 13, wherein the additional set comprises an additional tooth, and the additional finger extends between the additional tooth and a tooth of the second finger-teeth set.

16. The integrated analog/digital converter according to claim 13, wherein the reference finger and the fingers of the second finger-teeth set have matching first lengths, and the additional finger has a length substantially equal to half the first length.

17. The integrated analog/digital converter according to claim 13, wherein the reference finger and the fingers of the second finger-teeth set have matching first lengths, and the additional finger has a length less than half the first length.

18. A method of making an integrated capacitive device, the method comprising:
   forming an electrically conducting comb including a plurality of teeth, at least some of which define first electrodes of capacitors;
   forming electrically conducting fingers extending between the teeth of the comb to define second electrodes of the capacitors;
   the capacitors being defined by the plurality of teeth and corresponding fingers including
      a first finger-teeth set including a reference finger forming a reference capacitor having a reference capacitive value,
      at least one second finger-teeth set including several fingers distributed on at least one side of the reference finger,
      the reference finger and the several fingers of the at least one second finger-teeth set forming a geometric series with ratio two,
      at least one additional finger-teeth set including an additional finger defining, with at least one tooth of the comb, an additional capacitor having an additional capacitive value equal to a fraction of the reference capacitive value.

19. The method according to claim 18, wherein the additional capacitive value of the additional capacitor is substantially equal to half the reference capacitive value.

20. The method according to claim 18, wherein the additional set comprises an additional tooth, and the additional finger extends between the additional tooth and a tooth of the second finger-teeth set.

21. The method according to claim 20, wherein the reference finger and the fingers of the second finger-teeth set have matching first lengths, and the additional finger has a length substantially equal to half the first length.

22. The method according to claim 18, wherein the reference finger and the fingers of the second finger-teeth set have matching first lengths, and the additional finger has a length less than half the first length.

23. The method according to claim 18, wherein the reference finger and the fingers of the second finger-teeth set are embodied on a first even number of metallization levels, and the additional finger is embodied on a number of metallization levels equal to half the first even number.

24. The method according to claim 18, wherein the reference finger and the fingers of the second set have first ends situated respectively at a same first distance from a back of the comb; and wherein the back of the comb comprises at least one appendage extending opposite the additional finger, and the additional finger has an end situated at a distance greater than or equal to the first distance from the at least one appendage.

* * * * *